United States Patent
Galster et al.

[11] Patent Number: 6,159,830
[45] Date of Patent: Dec. 12, 2000

[54] PROCESS FOR ADJUSTING THE CARRIER LIFETIME IN A SEMICONDUCTOR COMPONENT

[75] Inventors: Norbert Galster, Rupperswil, Switzerland; Pavel Hazdra; Jan Vobecky, both of Prague, Czech Rep.

[73] Assignee: Asea Brown Boveri AG, Baden, Switzerland

[21] Appl. No.: 09/363,645

[22] Filed: Jul. 30, 1999

[30] Foreign Application Priority Data

Aug. 6, 1998 [DE] Germany ............... 198 35 528

[51] Int. Cl.[7] ............... H01L 21/426; H01L 21/425
[52] U.S. Cl. ............... 438/543; 438/531; 438/549
[58] Field of Search ............... 438/543, 511, 438/531, 549

[56] References Cited

U.S. PATENT DOCUMENTS

| | | |
|---|---|---|
| 4,357,178 | 11/1982 | Bergeron et al. . |
| 4,394,180 | 7/1983 | Dearnaley et al. . |
| 5,441,900 | 8/1995 | Bulucea et al. . |

FOREIGN PATENT DOCUMENTS

| | | |
|---|---|---|
| 0 387 506 A2 | 4/1998 | European Pat. Off. . |
| 42 24 686 A1 | 1/1994 | Germany . |
| 02058826 | 2/1990 | Japan . |

OTHER PUBLICATIONS

Characteristics of Bipolar Transistors with Various Depth N+ Buried Layers Formed by High Energy Ion Implantation by A. Tamba et al, pp. 141–144, published by Extended Abstracts of the 20th (1998 International) Conference on Solid State Materials, Tokyo, 1988.

Measuring the generation lifetime profile modified by MeV H+ ion implantation in silicon by N. Q. Khanh et al, pp. 111–115, published by Elsevier Science B.V., 1999.

*Primary Examiner*—Charles Bowers
*Assistant Examiner*—Evan Pert
*Attorney, Agent, or Firm*—Oblon, Spivak, McClelland, Maier & Neustadt, P.C.

[57] ABSTRACT

In a process for adjusting the carrier lifetime in a semiconductor component (1) by means of particle irradiation (P), at least two defect regions (10, 11, 12, 13) are produced in the semiconductor component (1). In this process, a particle beam (P), consisting of particles (a, b, c, d) with at least approximately the same initial energy, is acted on by at least one means (2), before reaching the semiconductor component (1), in such a way that the particles (a, b, c, d) subsequently have different energy values, at least two energy value groups being distinguishable. It is thereby possible, with a single particle irradiation operation, to produce an arbitrary number of defect regions whose arrangement and weighting is arbitrarily selectable.

15 Claims, 3 Drawing Sheets

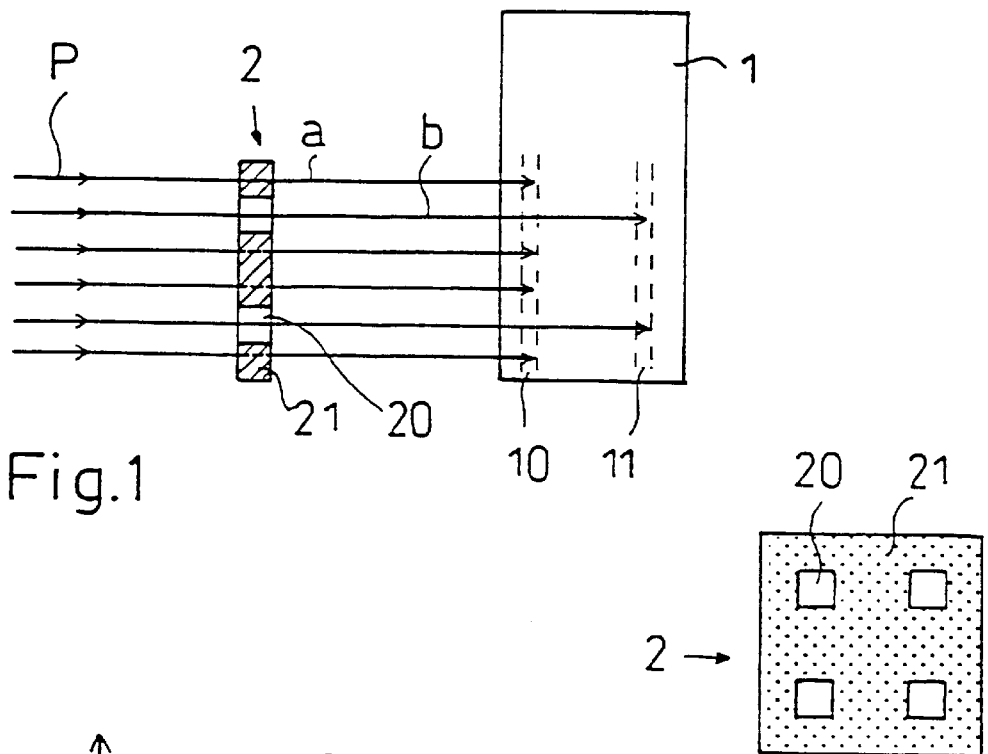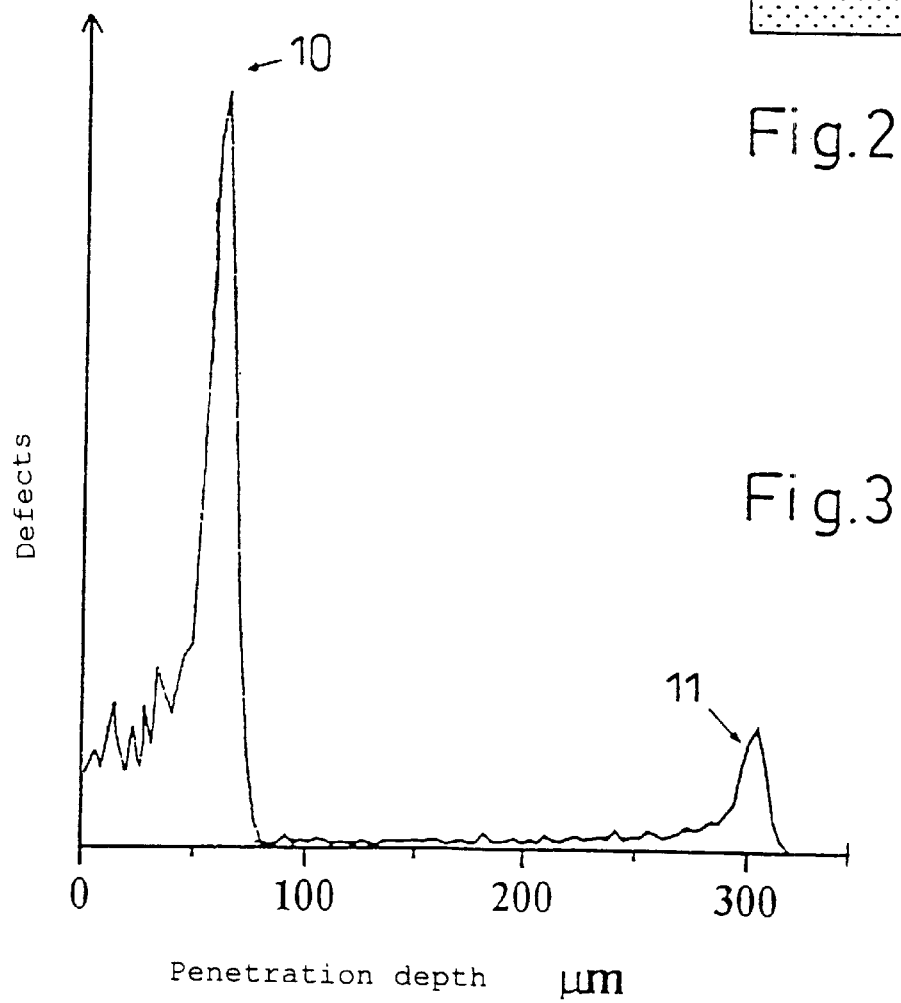

PROCESS FOR ADJUSTING THE CARRIER LIFETIME IN A SEMICONDUCTOR COMPONENT

BACKGROUND OF THE INVENTION

1. Field of the Invention

The present invention concerns the field of power electronics. It relates to a process for adjusting the carrier lifetime in a semiconductor component by introducing at least two defect regions with particle irradiation, and to means for implementing the process by using a mask to separate a beam of particles having substantially the same energy into a beam having at least two distinguishable energy groups.

2. Discussion of Background

The dynamic response of a semiconductor component is essentially influenced by its carrier lifetime. By adjusting the carrier lifetime it is possible, for example, to control on-state power losses, optimize off-state behavior and improve turn-off characteristics. The carrier lifetime is adjusted by producing defects in the semiconductor component. Such defects can basically be created in three ways: by irradiation with electrons, by doping with heavy metals, in particular with platinum or gold, or by particle irradiation with energetic heavy particles or ions, for example with protons or helium nuclei.

Irradiation with electrons leads to the defects being produced throughout the volume of the semiconductor substrate. Conversely, in the case of doping or particle irradiation, the semiconductor component is provided with defects only in a limited region, the rest of the component remaining virtually unaffected. This allows more controlled adjustment of the carrier lifetime. However, since doping processes are relatively expensive, particle irradiation has now become established as a technique for adjusting the carrier lifetime.

During this particle irradiation, a particle beam is directed at a surface of the semiconductor component, so that the particles penetrate into the semiconductor material and produce defects there. The density of the defects along the trajectory of the particles is small at first and increases steeply shortly before reaching the maximum penetration depth. The majority of the defects therefore lie in this area. The corresponding "average" penetration depth of the particles depends in this case on their energy and the composition of the matter to be penetrated. By selecting the particle energy, it is possible to determine their penetration depth in advance and therefore accurately adjust the position of the defect region. Since all the particles in the particle beam have the same energy, one particle irradiation operation produces a single defect region.

For many applications, however, a single particle irradiation operation is not sufficient to obtain an optimum turn-off characteristic. If a single defect region locally limited in a relatively sharp way is present, the current value in the turn-off process changes abruptly, overvoltages are induced and the voltage value starts to oscillate. It has, however, been shown that merely combining electron irradiation with particle irradiation leads to an improvement.

Further, it is disclosed by Solid State Electronics, Vol. 36, No. 2, pp. 133–141, 1993, that the turn-off process of a GTO (Gate Turn Off) thyristor can be improved if defect regions are present at a variety of penetration depths. To that end, the GTO is irradiated with particles several times, the individual irradiation operations being carried out with different energy values. This process does actually produce good results. However, multiple irradiation is expensive and increases the production times.

SUMMARY OF THE INVENTION

Accordingly, one object of the invention is to provide a novel process for adjusting the carrier lifetime in a semiconductor component and a means for implementing the process of the type mentioned at the start, which eliminate the disadvantages mentioned above.

In the process according to the invention, a semiconductor component is irradiated with a particle beam which is composed of particles with different kinetic energy. By means of this, with a single particle irradiation operation, it is possible to produce an arbitrary number of defect regions in the semiconductor component, the distribution and weighting of which can also be arbitrarily selected.

For this purpose, the particle beam is acted on, before reaching the semiconductor component, in such a way that its particles, which all have at least approximately the same initial energy when they leave the radiation source, then have different energy values, at least two energy value groups being distinguishable and the particles associated with an energy group having at least approximately the same energy. The number of groups correlates in this case with the number of defect regions to be produced.

The particle beam can be acted on in a relatively straight-forward way with the aid of at least one mask, in that at least a part of the particle beam passes through the latter. By special configuration of the mask, in particular by material selection and structuring, any desired number of energy groups with an arbitrary percentage of particles and therefore any desired axial distribution of defect regions in the semiconductor component can be obtained. In particular, two, three, four or more defect regions can be produced. Further, the individual defect regions can be isolated from one another or may partially overlap one another.

If a plurality of masks are arranged in the beam path, then complicated distributions and shapes of defect regions can be obtained with simply shaped mask types.

The particle beam is generally scattered when it passes through the mask, so that each energy group of emerging particles defines an energy band with a bandwidth dictated by scattering. The defect regions obtained are therefore wider than in the case of multiple irradiation. This broadening of the defect profiles has in turn a positive effect on the behavior of the semiconductor component, in particular on its turn-off characteristic.

Using a suitable distance between the mask and the target, or by scanning the target, or ion beam, and the mask, laterally uniform irradiation is obtained. If a mask is stationary relative to the semiconductor component during the irradiation and covers it only partially, then a lateral defect region distribution can also be obtained.

The process according to the invention can be used for adjusting the carrier lifetime in all known semiconductor components. It is suitable, in particular, for the production of semiconductor diodes.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 shows a representation of particle irradiation with a first mask;

FIG. 2 shows the mask according to FIG. 1 from above;

FIG. 3 shows the defect profile produced with the irradiation according to FIG. 1;

DESCRIPTION OF THE PREFERRED EMBODIMENTS

Figure 4:
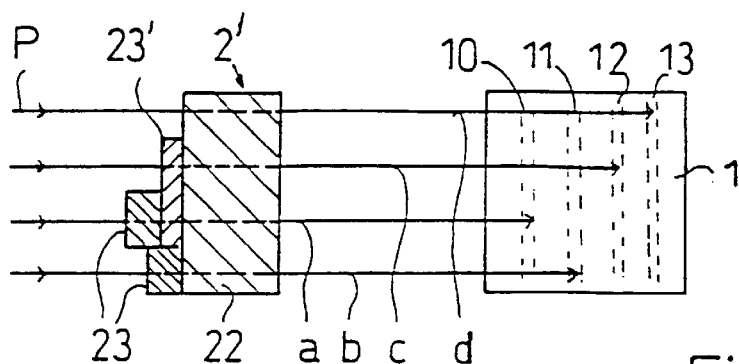
FIG. 4 shows a representation of particle irradiation with a second mask.

Referring now to the drawings, wherein like reference numerals designate identical or corresponding parts throughout the several views, FIGS. 1 to 3 represent a first variant of the process according to the invention. A semiconductor component 1 is irradiated with a particle beam P. The irradiation represented here takes place on the anode side, as it is carried out for example for power semiconductor diodes. The direction of the irradiation is not, however, essential to the present invention, but depends on the particular semiconductor component to be irradiated. If, as represented here, the particle beam P has a smaller area than the semiconductor component 1, then the semiconductor component 1 is moved during the irradiation so that its entire surface is successively exposed to the particle bombardment.

A mask 2 is arranged in the path of the particle beam P. It may, as represented here, cover the entire area of the beam path. In another embodiment, it acts only partially on it. The distance between the mask 2 and the surface of the semiconductor component 1 is not an absolutely essential parameter. Nevertheless, by selecting or varying the distance it is possible to select the irradiation density, since the particle beam generally becomes wider and wider with increasing distance from the mask.

The mask 2 can be fabricated from a very wide variety of materials, although a metal or plastic is preferably used for it. Examples of preferred materials include silicon, aluminum, nickel and platinum. The thickness of the mask depends on the braking effect to be obtained, typical values lying between 10 and 300 $\mu$m. A very wide variety of mask shapes can be used. The mask 2 represented in FIG. 2 has an array of holes with holes 20. In this case, only four holes are represented in order to represent the large number actually present. The ratio of holes 20 to solid surface 21 is in this case selected as a function of the defect profile to be obtained. It is normally between 1:1 and 1:20, and preferably is at least approximately 1:6. The size of the holes 20 is also tailored in terms of the result to be obtained. Typical values are 0.5–1 mm².

As represented in FIG. 1, the particle beam P passes through the mask 2 before it reaches the semiconductor component 1. Before reaching the mask 2, all its particles have at least approximately the same initial energy $E_0$. First particles a, which pass through the solid surface 21 of the masks, are braked. Their kinetic energy $E_1$ on leaving the mask 2 is less than the initial energy $E_0$. However, second particles b which go through the holes 20 are not affected and have the initial energy $E_0$ as before.

When the particles reach the semiconductor component 1, the second particles b with higher energy penetrate more deeply than the particles with lower energy. The first particles a then produce a first defect region 10 and the second particles b produce a second defect region 11. In this case, the first defect region 10 lies closer to the surface on the irradiation side than the second. This can be seen from FIGS. 1 and 3. A first peak, according to FIG. 3, at a penetration depth of approximately 70 $\mu$m corresponds in this case to the first defect region 10. The peak is substantially larger than a peak of the second defect region 11 at a penetration depth of about 300 $\mu$m, since because of the configuration of the mask more particles were braked than were able to go through unimpeded. As represented in FIG. 3, this second defect region 11 lies close to the surface on the cathode side, if an overall semiconductor component thickness of 350 $\mu$m is assumed. This arrangement is advantageous, in particular, for semiconductor diodes.

Figure 5:
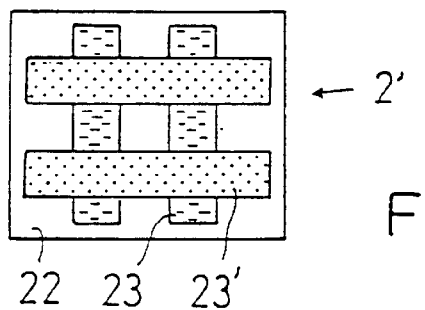
FIG. 5 shows the mask according to FIG. 4 from above.
Figure 6:
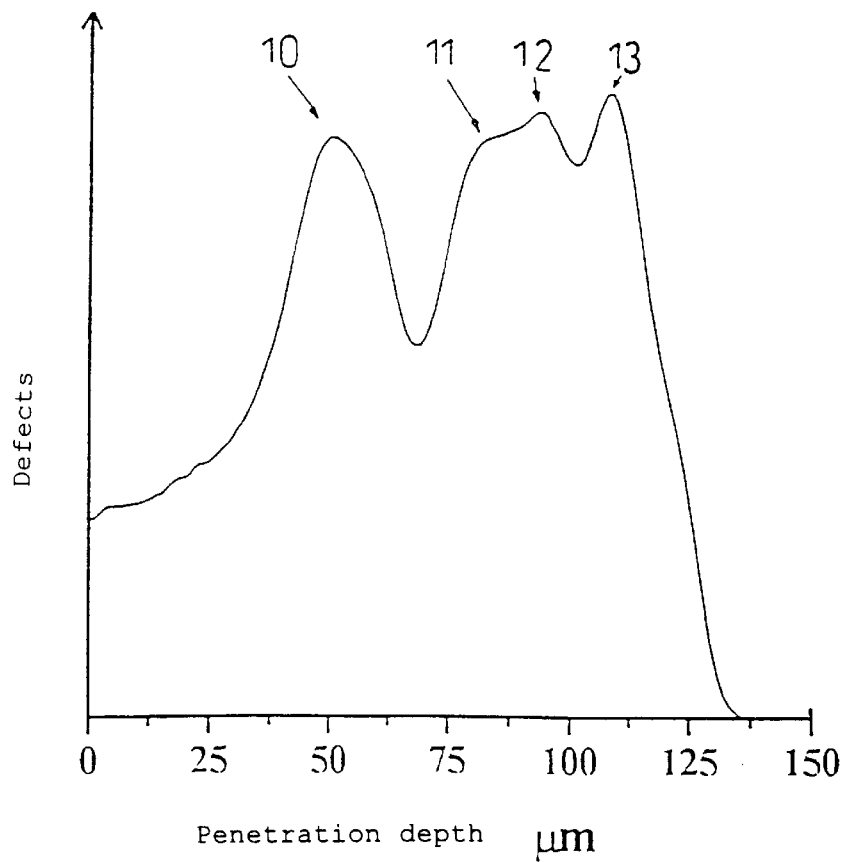
FIG. 6 shows the defect profile produced with the irradiation according to FIG. 4.

FIGS. 4 to 6 represent a second variant of the process according to the invention. A semiconductor component is made which, after a single particle irradiation operation, has four peaks, or defect regions 10, 11, 12, 13. It has been shown that increasing the defect regions improves the turn-off behavior.

The mask 2' used is represented in FIGS. 4 and 5. It consists of a variety of materials, namely a base 22 of a first material, for example silicon, to which one or more layers 23, 23' of other materials, for example platinum, are applied. In this example, however, no holes are present. In this case, FIG. 4 only shows the schematic structure of the mask 2', and does not correspond to a cross section through the mask 2' according to FIG. 5.

The particles in the particle beam P therefore pass through different transmission areas which vary from one another in terms of thickness and material composition. The arrangement represented here has four such transmission areas, so that after leaving the mask 2' the particle beam P essentially has particles a, b, c, d with four different energy values, which produce four defect regions 10–13 in the semiconductor component.

Figure 7:
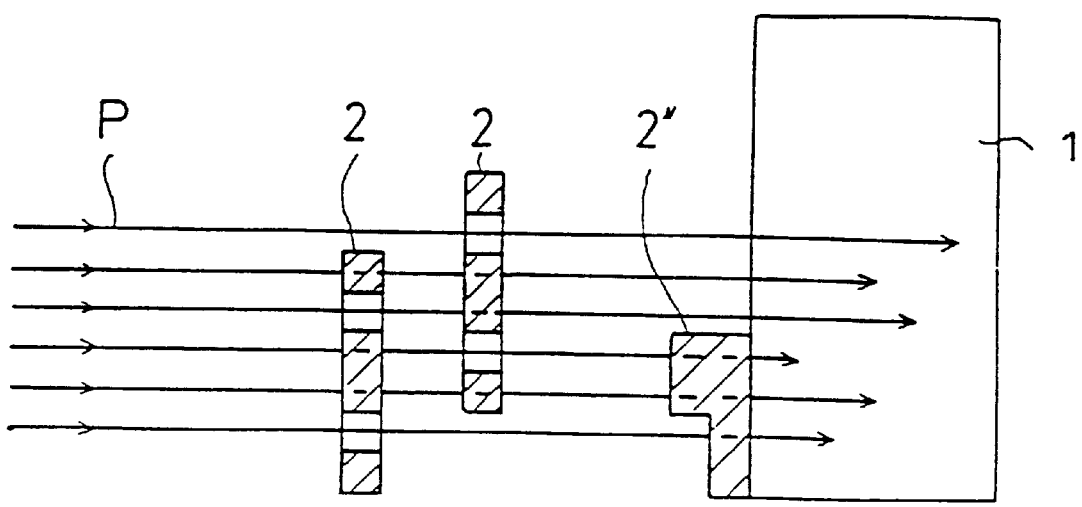
FIG. 7 shows a representation of particle irradiation according to a third variant of the process.

FIG. 7 represents a third arrangement for implementing the process according to the invention. In this case, a number of masks 2, to be precise two, are arranged one behind the other. The masks may be identical, as is represented here, their transmission areas being arranged offset relative to one another in the beam path. This has the advantage that it is only necessary to fabricate a single and relatively simple mask type. It is, however, also possible to arrange masks with different shapes behind one another. There is further a third mask 2" which is arranged in a stable position relative to the semiconductor component 1. In this example, it is therefore applied directly to the semiconductor component 1. This third mask 2" permits lateral variation of the defect profile.

What is claimed as new and desired to be secured by Letters Patent of the United States is:

1. A process for adjusting the carrier lifetime in a semiconductor component by means of particle irradiation, at least two defect regions being produced in the semiconductor component, wherein a particle beam, consisting of particles with at least approximately the same initial energy, is acted on by at least one means, before reaching the semiconductor component, in such a way that the particles subsequently have different energy values, at least two energy value groups being distinguishable, such that said at least two defect regions are produced at substantially different depths and said at least two defect regions comprise a first and a second defect region, said second defect region being at least partially covered by said first defect region in a direction of said irradiation.

2. The process as claimed in claim 1, wherein at least a part of the particle beam passes through at least one mask before reaching the semiconductor component.

3. The process as claimed in claim 2, wherein the semiconductor component is moved relative to the mask.

4. The process as claimed in claim 1, wherein a single particle irradiation operation is carried out.

5. The process as claimed in claim 2, wherein the entire particle beam passes through the at least one mask.

6. The process as claimed in claim 1, wherein the particle beam passes through at least one mask which is arranged in a stable position relative to the semiconductor component.

7. A means of acting on a particle beam in order to implement the process as claimed in claim 1, which means is a mask that brakes particles of the particle beam which pass through it.

8. The means as claimed in claim 7, wherein the mask is subdivided into at least two areas that exert different braking effects from one another on particles which pass through them.

9. The means as claimed in claim 8, wherein the areas have different thicknesses.

10. The means as claimed in claim 8, wherein the mask has holes.

11. The means as claimed in claim 7, wherein said means is made from at least one of metal and plastic.

12. The process as claimed in claim 1, wherein the mask is arranged in such a distance to the semiconductor component, that a lateral uniform irradiation is obtained.

13. A process for adjusting the carrier lifetime in a semiconductor component by means of particle irradiation, at least two defect regions being produced in the semiconductor component, wherein a particle beam, consisting of particles with at least approximately the same initial energy, is acted on by at least one means, before reaching the semiconductor component, in such a way that the particles subsequently have different energy values, at least two energy value groups being distinguishable such that said at least two defect regions are produced at substantially different depths and that a lateral uniform irradiation is obtained.

14. The process as claimed in claim 13, wherein the mask is arranged in such a distance to the semiconductor component, that said lateral uniform irradiation is obtained.

15. The process as claimed in claim 13, wherein the semiconductor component is moved relative to the mask.

* * * * *